United States Patent
Martinez et al.

(10) Patent No.: US 7,525,222 B2
(45) Date of Patent: Apr. 28, 2009

(54) SENSOR ASSEMBLY AND SENSING SYSTEM FOR SENSING HUMAN TISSUE IN A PROTECTED AREA OF A MACHINE

(75) Inventors: Robert E. Martinez, Austin, TX (US); Todd Goyen, San Antonio, TX (US); Jack Nunes, Gilbraltor, MI (US)

(73) Assignee: Federal - Mogul World Wide, Inc., Southfield, MI (US)

( * ) Notice: Subject to any disclaimer, the term of this patent is extended or adjusted under 35 U.S.C. 154(b) by 384 days.

(21) Appl. No.: 11/293,943

(22) Filed: Dec. 5, 2005

(65) Prior Publication Data

US 2007/0126291 A1   Jun. 7, 2007

(51) Int. Cl.
*H02H 11/00* (2006.01)

(52) U.S. Cl. .................................... 307/326; 192/130

(58) Field of Classification Search ................ 307/326; 324/207.26, 458; 340/686.5, 686.6; 192/130
See application file for complete search history.

(56) References Cited

U.S. PATENT DOCUMENTS

| | | | | |
|---|---|---|---|---|
| 3,947,734 A | 3/1976 | Fyler | ............................ | 317/146 |
| 3,953,770 A | 4/1976 | Hayashi | ........................ | 317/146 |
| 4,070,940 A | 1/1978 | McDaniel et al. | ............... | 83/464 |
| 4,075,961 A | 2/1978 | Harris | .......................... | 112/277 |
| 4,249,074 A | 2/1981 | Zettler et al. | ................. | 250/221 |
| 4,280,164 A | 7/1981 | Kozek | .......................... | 361/179 |
| 4,818,866 A | 4/1989 | Weber | .......................... | 250/221 |
| 4,965,909 A | 10/1990 | McCullough et al. | ........... | 17/21 |
| 5,198,702 A | 3/1993 | McCullough et al. | ........ | 307/326 |
| 5,235,319 A * | 8/1993 | Hill et al. | .................. | 340/573.4 |
| 5,272,946 A | 12/1993 | McCullough et al. | ........... | 83/58 |
| 5,510,685 A | 4/1996 | Grasselli | ....................... | 318/434 |
| 5,880,954 A | 3/1999 | Thomson et al. | ............. | 364/184 |
| 5,921,367 A | 7/1999 | Kashioka et al. | ............. | 192/130 |
| 6,376,939 B1 | 4/2002 | Suzuki et al. | ................ | 307/326 |
| 6,750,564 B2 | 6/2004 | Cencur | ........................ | 307/116 |
| 2001/0041077 A1 | 11/2001 | Lehner et al. | ................ | 396/661 |

FOREIGN PATENT DOCUMENTS

EP          0 793 208          9/1997

* cited by examiner

*Primary Examiner*—Albert W Paladini
*Assistant Examiner*—Carlos Amaya
(74) *Attorney, Agent, or Firm*—Robert L. Stearns; Dickinson Wright PLLC

(57) ABSTRACT

The invention provides a sensor assembly which can sense human tissue in a protected area of a machine. An emitter plate and a plurality of sensor plates are disposed co-planar to each other and adjacent to the protected area of the machine. An electric field is generated between the emitter plate and the sensor plates and directed towards the protected area. The sensor plates produce electrical signals corresponding to the electric field received at the sensor plate. The electrical signals are amplified, measures, and analyzed to determine if human tissue is within the protected area. If human tissue is detected, a machine interface circuit will shut down the machine to prevent injury.

1 Claim, 6 Drawing Sheets

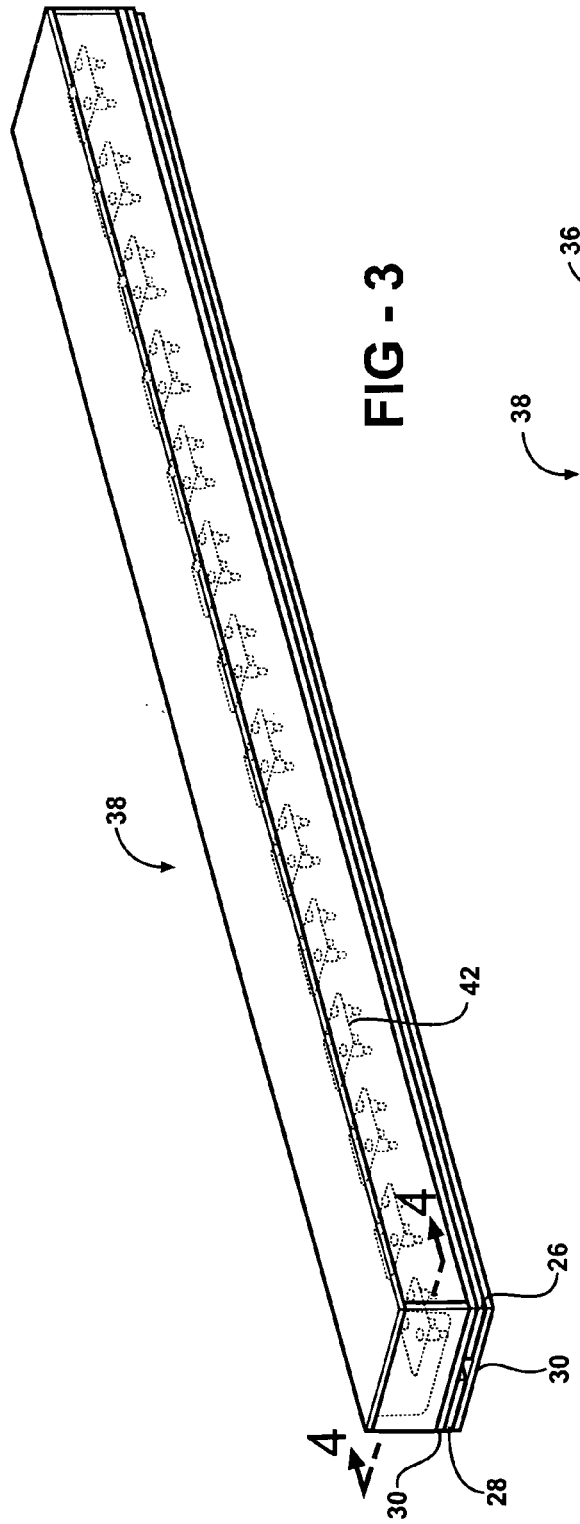
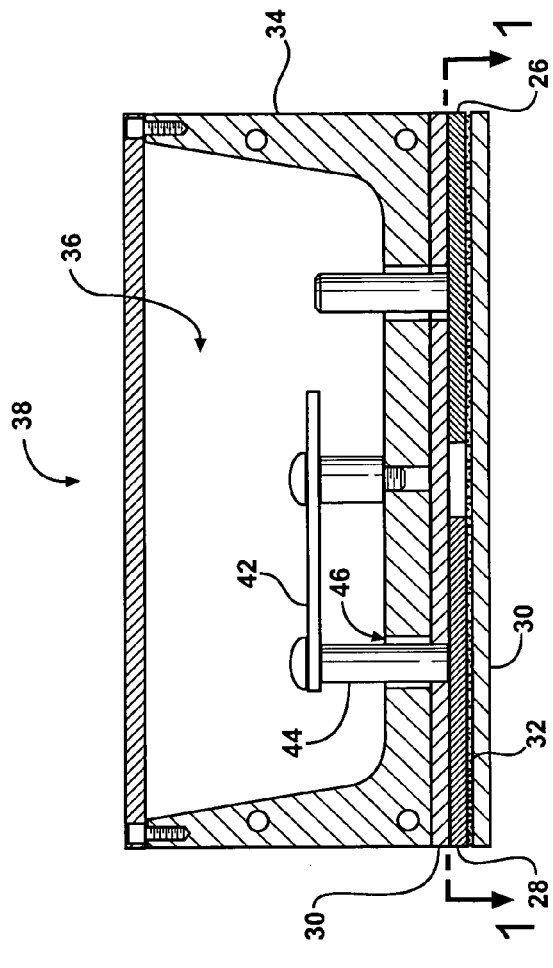
FIG - 3
FIG - 4

SENSOR ASSEMBLY AND SENSING SYSTEM FOR SENSING HUMAN TISSUE IN A PROTECTED AREA OF A MACHINE

BACKGROUND OF THE INVENTION

1. Field of the Invention

A sensor assembly for sensing human tissue in a protected area of a machine.

2. Description of the Prior Art

Automated manufacturing machines can pose a hazard to their human operators. These machines typically have moving components that may produce enormous forces and cause an operator injury. They are often outfitted with various forms of safety devices in order to reduce the danger to their human operators. These devices include emergency mechanisms that include a sensor and/or switch that sense operator presence in a protected area and produce as signal that is used to deactivate the machine, these include stop pushbuttons, safety latches, light beams, optical sensors, weight sensors, kick bars, belly bars, and pull bars, to name a few. However, these devices are often not optional in the applications in which they are implemented. Therefore, these devices are frequently used in various combinations in order to enhance the sensing of various hazardous conditions. Thus, these devices sometimes fail to give optimum protection for the operators. For example, they may afford protection for some hazards and not others. These problems are evident many applications, including a typical rubber mill.

A rubber mill utilizes at least one pair of rollers. The rollers of each pair are driven in mutually opposite directions. In normal operation, rubber is inserted (by the operator) into the rollers for flattening. This operation causes a potentially dangerous situation in which a worker can inadvertently get his or her fingers, hand or arm caught in the rollers. The roller construction, dimensions and spacing are sufficient to cause severe injury should this occur.

One approach to protecting an operator is disclosed in U.S. Pat. No. 6,376,939 (the '939 patent) to Suzuki et al. The '939 patent discloses a sensor apparatus having two electrodes disposed on opposite sides of a protected area of a machine. Material being fed into the machine must pass between the two plates. A circuit detects capacitance change between the electrodes as objects pass between the two plates. A monitor then attempts to determine whether the object includes human tissue.

Unfortunately, due to the planar separation of the electrodes, space restrictions make the sensor apparatus of the '939 patent can be difficult to implement in many machines. Furthermore, the apparatus may not be able to detect human tissue that is embedded within a dielectric, such as the rubber sheets that are being fed into the rollers of the rubber mill by the operator.

There remains an opportunity for a sensor apparatus which can be implemented in machines having two or three dimensional protected areas or spaces where it is desirable to detect human or other animal tissue within these areas or spaces. Still further, there remains an opportunity for an apparatus which can detect the presence of such tissues in the presence of other materials, such as dielectric materials, and particularly in the presence of rubber.

SUMMARY OF THE INVENTION AND ADVANTAGES

The invention provides a sensor assembly for sensing human or other animal tissue, and is particularly suited for sensing human tissue in a protected area of a machine. The sensor assembly includes a power source. An emitter plate, formed of an electrically conductive material, is disposed adjacent to the protected area of the machine. The emitter plate is electrically connected to the power source for generating an electric field directed towards the protected area. At least one sensor plate, also formed of an electrically conductive material, is disposed adjacent to the protected area. The at least one sensor plate receives the electric field and produces an electrical signal corresponding to the electric field. The at least one sensor plate is disposed adjacent to and substantially coplanar with the emitter plate. A device such as a meter, electrically connected to the at least one sensor plate and measures the properties or characteristics of the electrical signal produced by the at least one sensor plate, such as the capacitance. An analyzer is electrically connected to the meter for analyzing the properties of the electrical signal and determining if the properties are indicative of human tissue disposed within the protected area.

The invention also provides a sensor assembly including a power source electrically connected to at least one emitter plate. The emitter plate is formed of an electrically conductive material and disposed adjacent to a protected area of a machine. The emitter plate operates to generate a dynamic electric field within the protected area in response to application of the dynamic electric waveform from the power source to the emitter plate. At least one sensor plate formed of an electrically conductive material is disposed adjacent to the protected area. The sensor plate receives the dynamic electric field and produces an electrical signal which is operative to vary in response to changes in the electric field. At least one meter is electrically connected to the at least one sensor plate for measuring at least one property of the electrical signal produced by the at least one sensor plate. A signal analyzer is electrically connected to the meter for analyzing the at least one property of the electrical signal and is operative to determine if the property is indicative of human tissue disposed within the protected area.

Due to the co-planar configuration of the emitter plate in relation to the at least one sensor plate, the sensor assembly of the present invention may be implemented in machines having various spacings between the plates, and thus is suitable for use in a wide variety of applications. The application of a dynamic electric field allows the sensor assembly to detect human tissue embedded with sheets of rubber.

BRIEF DESCRIPTION OF THE DRAWINGS

Other advantages of the present invention will be readily appreciated, as the same becomes better understood by reference to the following detailed description when considered in connection with the accompanying drawings wherein like elements in the figures are given like notations, and wherein:

FIG. 3 is an assembled perspective view of the sensing bar;

FIG. 4 is a cross-sectional end view of the sensing bar along the line 4-4 in FIG. 3;

DETAILED DESCRIPTION OF THE INVENTION

Referring to the Figures, wherein like numerals indicate corresponding parts throughout the several views, the subject invention provides a sensor assembly 20 for sensing human tissue in a protected area 22 of a machine 24.

Figure 1:
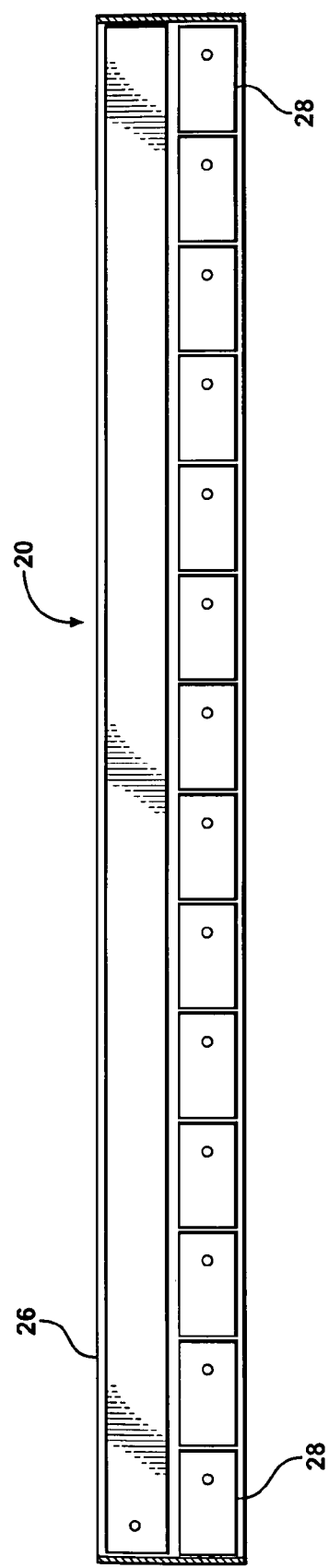
FIG. 1 is top view of an emitter plate and a plurality of sensor plates.

Referring to FIG. 1, the sensor assembly 20 includes an emitter plate 26. The emitter plate 26 is formed of an electrically conductive material. The electrically conductive material is preferably copper, aluminum or steel. However, other suitable conductive materials are known to those skilled in the art.

The sensor assembly 20 further includes at least one sensor plate 28. The at least one sensor plate 28 is preferably disposed adjacent to the emitter plate 26. Furthermore, it is preferred that the at least one sensor plate 28 is substantially coplanar with the emitter plate 26. However, the at least one sensor plate 28 need not be coplanar with the emitter plate 26 to function properly. The at least one sensor plate 28 is formed of an electrically conductive material. It is preferred that at least one sensor plate 28 and the emitter plate 26 utilize the same type of electrically conductive material. The at least one sensor plate 28 and the emitter plate 26 are separated by a nonconductive dielectric, such as, but not limited to, air.

In a preferred embodiment, the at least one sensor plate 28 is implemented as a plurality of sensor plates 28. The quantity of sensor plates 28, shape and dimensions of the sensor plates 28, shape and dimensions of the emitter plate 26, and placement of the sensor plates 28 with respect to the emitter plate 26 are necessitated by the dimensions of the protected area 22 of the machine 24, the characteristics of the body part (human tissue) that is likely to enter the protected area 22, and other factors that are obvious to one skilled in the art. For example, where the body part likely to enter the protected area 22 is a hand, the sensor plates 28 are preferably sized no larger than a typical human hand. For convenience, the at least one sensor plate 28 will be referred to hereafter as the sensor plates 28, but this usage should not be construed as limiting.

In the preferred embodiment, as shown in FIG. 1, the emitter plate 26 is substantially rectangular in shape with exemplary dimensions of a length of about 54 inches and a width of about 2 inches. The sensor assembly 20 includes fourteen (14) sensor plates 28. Each sensor plate 28 is substantially rectangular with exemplary dimensions of a length of about 3.65 inches and a width of about 2 inches. The sensor plates 28 are spaced apart from each other and disposed lengthwise such that they are substantially parallel to the emitter plate 26. As such, the combined length of the sensor plates 28, along with inter-plate spacing, is generally equivalent to the length of the emitter plate 26 (i.e., in this example about 54 inches). The sensor plates 28 are separated from the emitter plate 26 by about 1.5 inches. In the preferred embodiment, the sensor plates 28 are disposed on one side of the emitter plate 26. In a first alternative embodiment shown in FIG. 3, the sensor plates 28 may be disposed on both sides of the emitter plate 26. In a second alternative embodiment shown in FIG. 4, the sensor plates 28 may be disposed around the emitter plate 26. Furthermore, as mentioned above, the plates 26, 28 may have any shape and are not limited to rectangles (e.g., circular, triangular, elliptical and other regular and irregular curvilinear shapes). Moreover, multiple emitter plates 26 may be implemented. In addition, plates 28 need not be of the same shape or size or have the same spacing either for one another or emitter plate 26. Further, in cases when emitter plates 26 are used, plates 26 need not have the same shape or size or have the same spacing for sensor plates 28. By varying these characteristics, as well as by varying the magnitude of the applied potential, the magnitude and shape and size of the electric field my be varied to extend the sensed area and volume to cover protected areas 22 having many different two and three dimensional shapes and sizes.

The shape, size and strength of the electric field associated with the embodiments of FIGS. 1-4 are different and may be determined using known instrumentation or methods for measuring or calculating electrical field strength respectively. The arrangements of sensor plates 28 and emitter plate or plates 26 may be selected to obtain an electric field which is particularly adapted to detect the presence of human or other tissue in a certain area or volume of a machine or other item for which such detection is desired.

Figure 2:
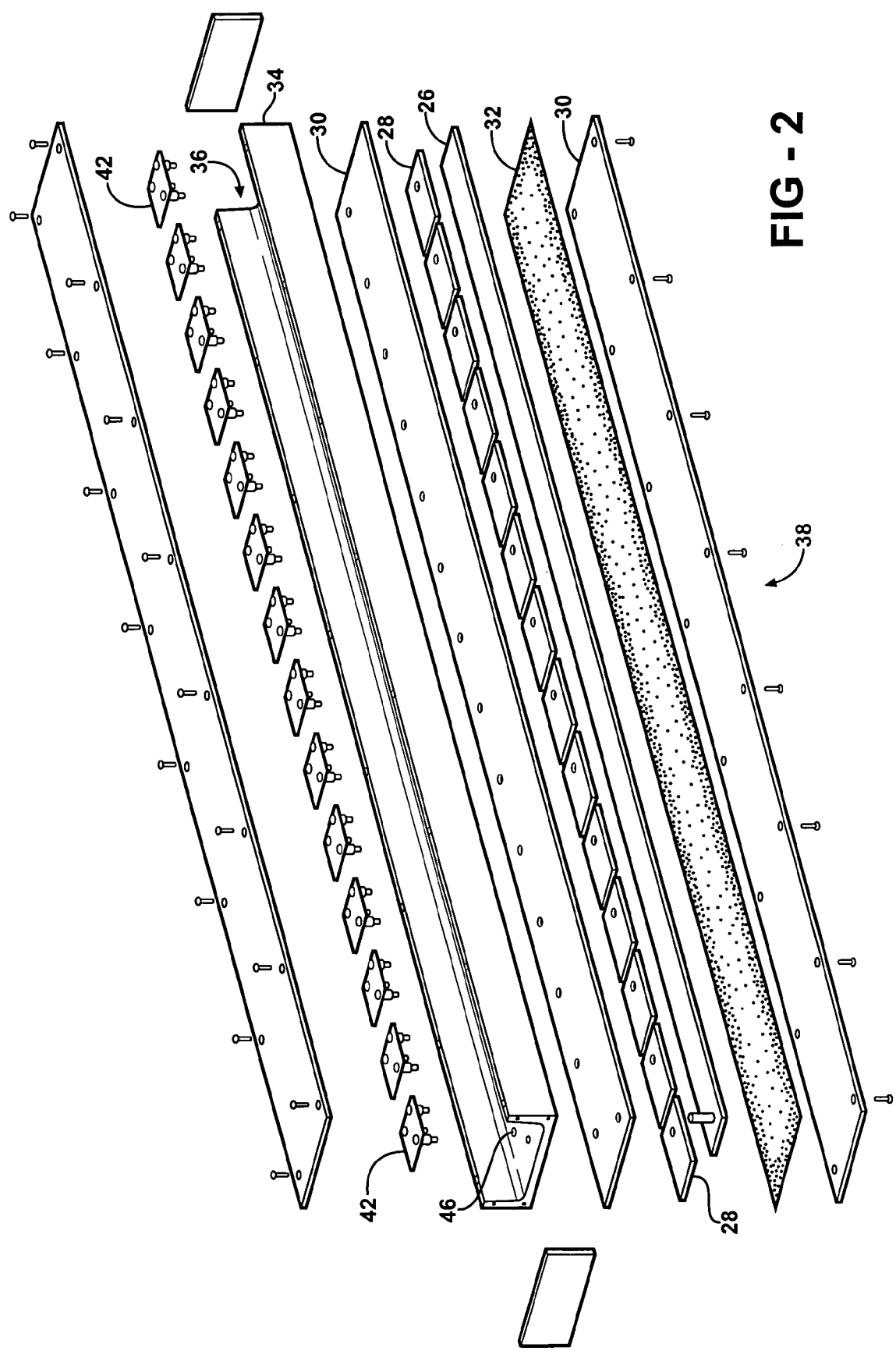
FIG. 2 is an exploded perspective view of a sensing bar showing the plates integrated with insulation layers, a support member, and amplifiers.

Referring now to FIGS. 2-4, the emitter plates 26 and sensor plates 28 are sandwiched between a pair of insulation layers 30 for electrically insulating the plates 26, 28. An adhesive layer 32 is also sandwiched between the insulation layers 30. The adhesive layer 32 serves to adhere the insulation layers 30 and the plates 26, 28 together and provide a dielectric medium between each plate 26, 28. The area of the insulation layers 30 and the adhesive layers 32 is preferably larger than the area formed by the layout of the plates 26, 28 to completely encase the plates 26, 28 within the insulation layers 30.

The sensor assembly 20 further includes a support member 34. The support member 34 supports the insulation layers 30 and the plates 26, 28. The support member 34 is formed of an electrically conductive material. Therefore, the support member 34 also provides a ground plane for the plates 26, 28, as will be discussed additionally later. The support member 34 preferably defines a channel 36. The channel 36 provides a convenient area for housing electrical connections and other components as will be described later.

For convenience and clarity purposes, the structure formed by the support member 34, insulation layers 30, and plates 26, 28 may be referred to hereafter as a sensing bar 38. Those skilled in the art realize that this usage is in no way limiting and the invention may be practiced without the plates 26, 28 being encased in the insulation layers 30 or attached to the support member 34.

Figure 5:
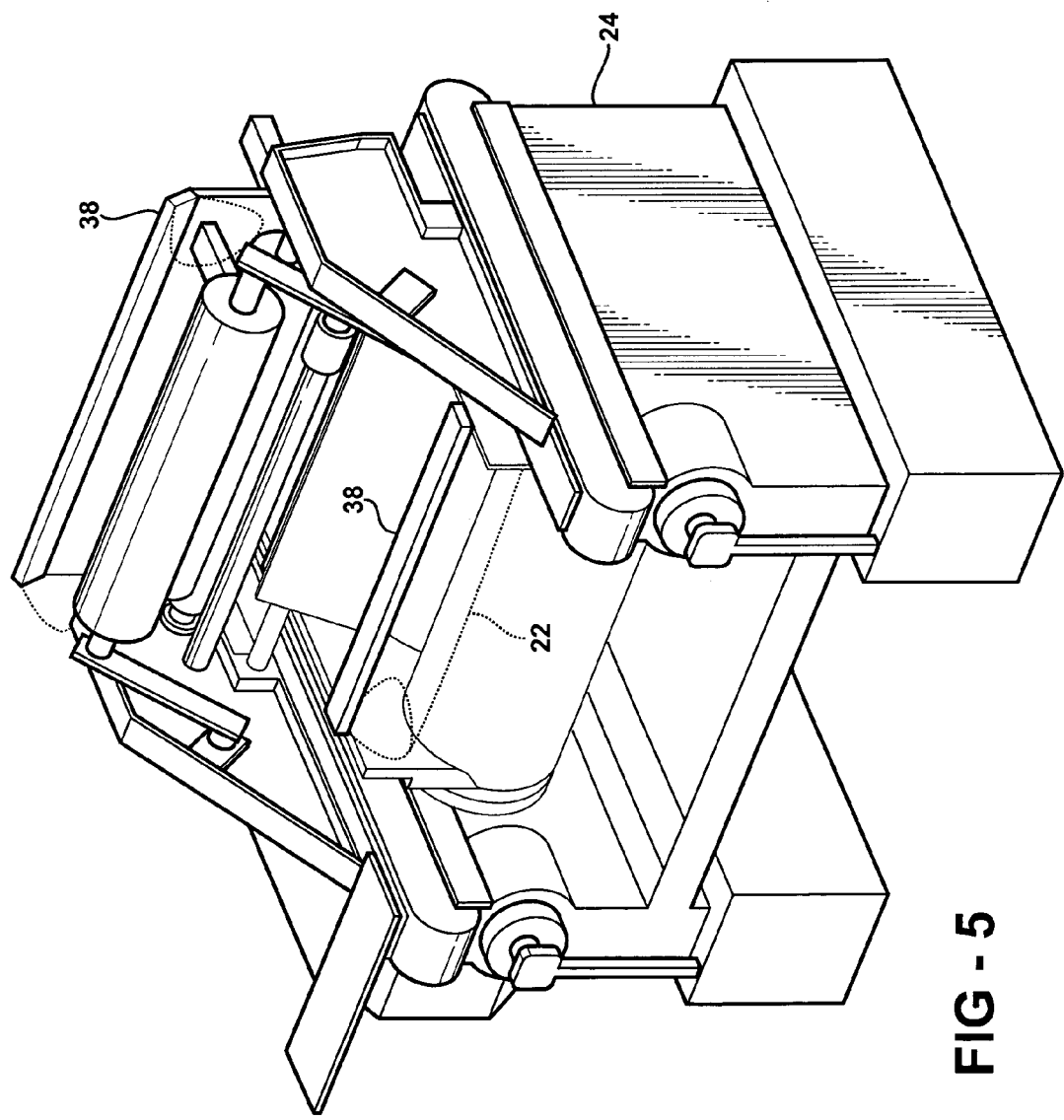
FIG. 5 is a perspective view of a machine showing preferred mounting locations of a plurality of sensing bars.
Figure 7:
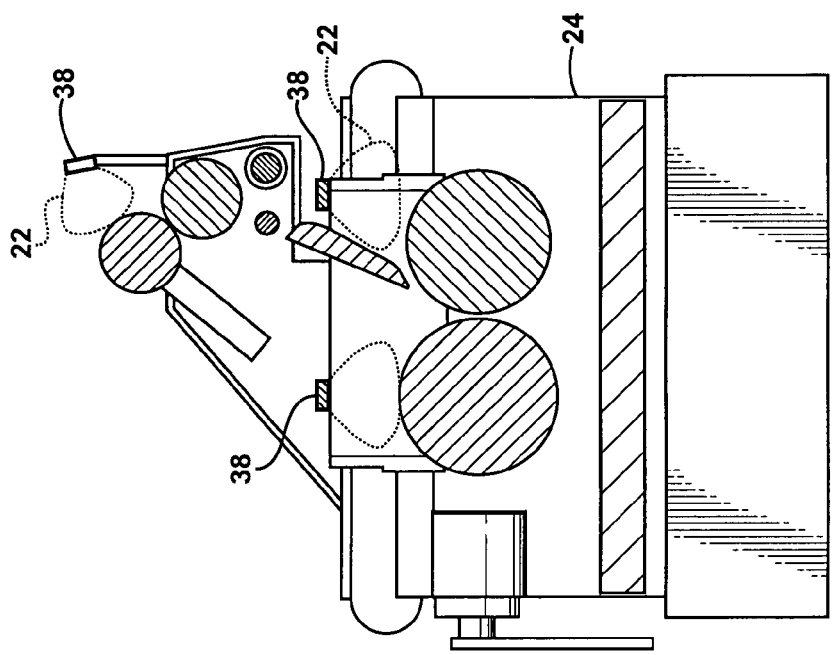
FIG. 7 is a cross-sectional view of the machine along the line 7-7 in FIG. 6.
Figure 6:
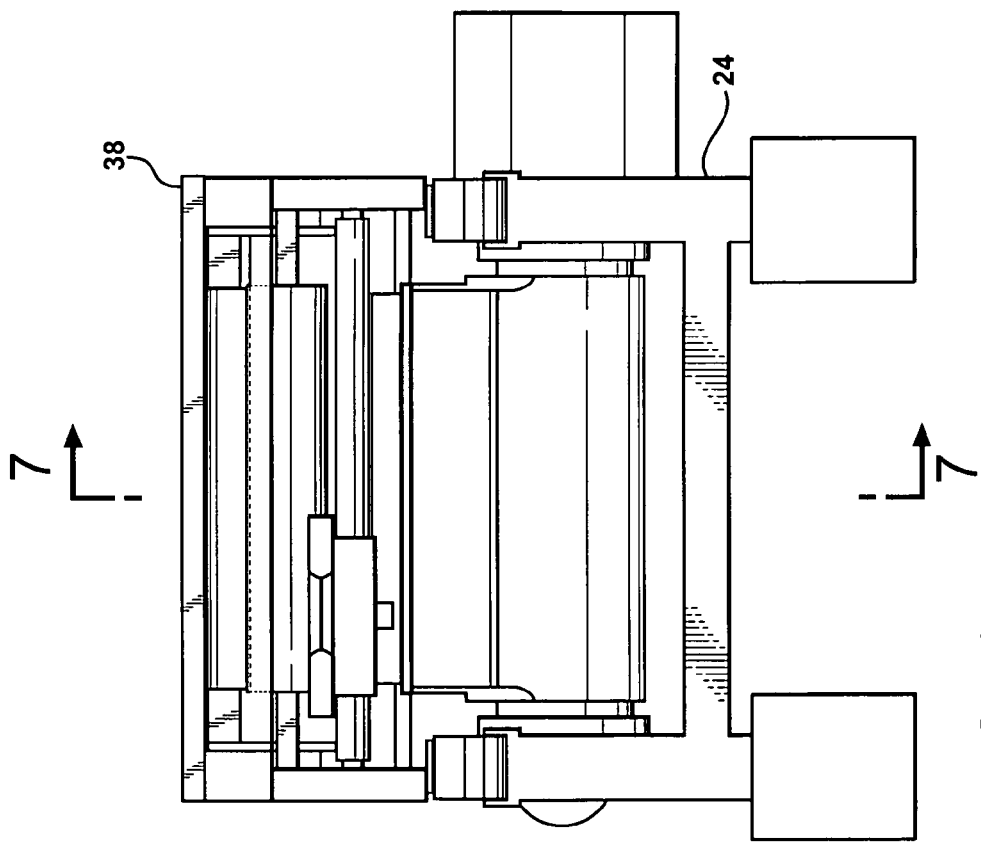
FIG. 6 is a side view of the machine.

Referring now to FIGS. 5 through 7, in the preferred embodiment, the sensing bar 38 is mounted to the machine 24 such that the emitter plate 26 and the sensor plates 28 are disposed adjacent to the protected area 22 of the machine 24. The plates 26, 28 are disposed between the support member 34 and the protected area 22 of the machine 24. Of course, a plurality of sensing bars 38, each with their own set of emitter and sensor plates 26, 28, may be mounted on the machine 24, depending on the quantity of protected area(s) 22, the size of the protected area(s) 22, etc.

The machine 24 of the preferred embodiment is a rubber mill as described in the "Background" section above. The protected areas 22 of the rubber mill are obviously the points where rollers create "pinch points", as well as the entry passages to these points.

Figure 8:
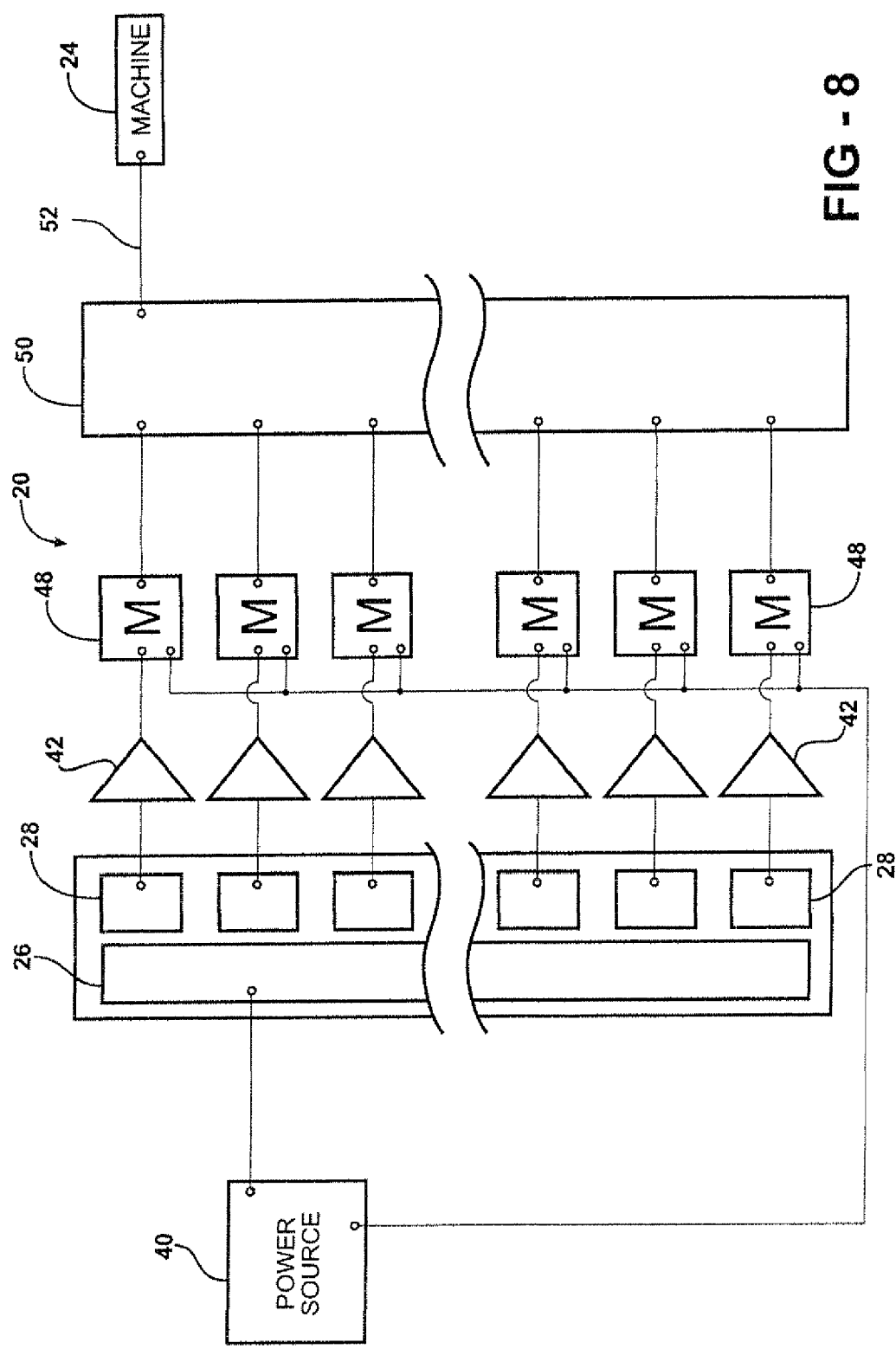
FIG. 8 is a schematic block diagram showing electrical connections between a power source, the emitter plate, the sensor plates, the amplifiers, meters, an analyzer, and the machine.

Referring to FIG. 8, sensor assembly 20 may also include a power source 40. Power source 40 is electrically connected to the emitter plate 26. Preferably, the power source 40 is a function generator to provide a 1 Vp-p, 250 kHz electrical waveform to the emitter plate 26. Other voltages and frequencies of the electrical waveform may also be utilized.

Referring to FIG. 8, when energized by the power source 40, the emitter plate 26 generates a dynamic electric field which may be varied in either the frequency domain (i.e., frequency-varying) or time domain (i.e., time-varying) and which is received by the sensor plates 28. Referring to FIGS. 5-7 the electric field is directed towards the protected area 22 of the machine 24. In all embodiments of sensor assembly 20, a capacitance is produced between the emitter plate 26 and the sensor plates 28. When an object enters the electric field (i.e., passes near the plates 26, 28), the capacitance between the plates 26, 28 is changed.

In the case of dynamic electric field, each sensor plate 28 produces an electrical signal having a displacement current. Each electrical signal corresponds to the electric field received at each sensor plate 28. Human tissue is conductive due to the large percentage of water that makes up the human body. Therefore, when human or other animal tissue, such as a hand or other body part, enters the electric field, some of the field is shunted to the body's stray capacitance. This results in a significant reduction (i.e., lowering) of the displacement current of the electrical signal generated by the sensor plate(s) 28 near the human tissue. However, rubber is an insulator (i.e., non-conductive). Therefore, when rubber (or another insulator) enters the electric field, no significant reduction of the displacement current occurs. Said another way, the change in displacement current is different in sign for human tissue than for rubber. Therefore, the sensor assembly 20 is operative to discriminate between human tissue and the insulating material being processed in the machine, such as rubber.

Sensor assembly 20 also may include an amplifier 42 for amplifying the electric signal produced by sensor plates 28. Amplifier 42 may be electrically connected to each sensor plate 28 for amplifying the electrical signal. Each amplifier 42 is preferably physically as close as possible to the sensor plate 28, to avoid contamination of the electrical signal from sources of electrical interference. In the preferred embodiment, the amplifiers 42 are disposed in channel 36 of the support member 34, as best seen in FIG. 4. A sensor bridge piece 44 electrically connects the sensor plate 28 and the amplifier 42 through a hole 46 defined in the support member 34. However, the amplifiers 42 may be located more distant from the sensor plates 28 and electrically connected with a shielded cable which helps to reduce contamination by electrical interference. In an alternate embodiment (not shown) electric signals could be multiplexed and an amplifier 42 could be electrically connected to the multiplexed signal.

The amplifier 42 is preferably a current-to-voltage amplifier 42 for converting the displacement current to a voltage. The current-to-voltage amplifier 42 may include a feedback loop (not shown) having a T bridge circuit (not shown). The T bridge circuit increases the bandwidth by lowering the effective impedance seen by the amplifier 42. Suitable techniques and components for T bridge circuits are well known to those skilled in the art. Preferably, the current-to-voltage amplifier 42 has a bandwidth up to about 1 MHz.

Referring again to FIG. 8, sensor assembly 20 may also include a meter 48. Meter 48 is electrically connected to each sensor plate 28 via the amplifier 42. The meter 48 measures properties of the electrical signal produced by the sensor plate 28. Preferably, the meter 48 is a voltage meter for measuring the voltage produced by the amplifier 42. Experimentation with the sensor assembly 20 has shown that a human hand located 12 inches from one of the sensor plates 28 and embedded under 6 inches of rubber results in a voltage reduction of 2.5 mV measured at the meter 48. The rubber alone does not provide a voltage reduction on a similar scale.

Those skilled in the art realize that the meter 48 can be implemented as a current meter for measuring current, a capacitance meter for measuring capacitance, etc. The construction and operation of meter 48 may be in accordance with conventional meter construction and operational methods. Those skilled in the art realize that the amplifier 42 and meter 48 could be combined into an integrated unit. Also, as shown in FIG. 8, if the signal is multiplexed and demultiplexed, a single meter 48 may be used to measure the properties of all sensor plates 28.

Referring again to FIG. 8, sensor assembly 20 may also include a signal analyzer 50. Signal analyzer 50 is electrically connected to the meters 48 for analyzing the properties of the electrical signals. These electrical signals correspond to the displacement currents received at the sensor plates 28. This analyzer 50 determines if the properties are indicative of human tissue disposed within the protected area 22 (e.g., a reduction in voltage as described above). Specifically, in the preferred embodiment, the signal analyzer 50 monitors the electrical signal for rapid temporal changes (i.e., changes occurring within approximately one second) from an established average. The signal analyzer 50 also monitors the electrical signal for spatial changes, by comparing the electrical signals from multiple meters 48 to determining if human tissue is disposed within the protected area 22. Additionally, the signal analyzer 50 may determine if a malfunction has occurred in one or more of the sensor plates 28, amplifiers 42, or meters 48. As shown in FIG. 14, sensor assembly 20 may use a single signal analyzer 50 to analyze signals from all sensor plates 28. The construction and operation of signal analyzer 50 may be in accordance with conventional signal analyzer construction and operational methods.

As shown in FIG. 8, a machine interface circuit 52 is preferably electrically connected to the analyzer 50 and the machine 24. The machine interface circuit 52 is operative to provide a stop signal to stop the machine 24 in response to the analyzer 50 determining that human tissue is present in the protected area 22. The stop signal may also be activated in response to a malfunction in the sensor apparatus being detected by the analyzer 50.

Obviously, many modifications and variations of the present invention are possible in light of the above teachings. It is, therefore, to be understood that within the scope of the appended claims, the invention may be practiced otherwise than as specifically described.

What is claimed is:

1. A sensor assembly for use at a protected area of a machine, the sensor assembly comprising:
   a power source producing a time-varying electric waveform;
   an electrically conductive emitter plate disposed adjacent to the protected area, electrically connected to the power source, and operating to generate a time-varying electric field within the protected area in response to application of the time-varying electric waveform from the power source to the emitter plate;
   plural electrically conductive sensor plates disposed adjacent to the protected area for receiving the time-varying electric field and producing respective electrical signals that vary in response to changes in the electric field;
   plural meters, each electrically connected to a respective one of the sensor plates, to measure a respective displacement current of the electrical signal produced at the respective sensor plate; and
   a signal analyzer electrically connected to the plural meters to monitor the respective displacement currents measured by the plural meters to find an average displacement current, sensing a disturbance in one of the displacement currents, and comparing the sensed displacement current disturbance to the average displacement current to determine whether the sensed displacement current disturbance is indicative of human tissue within the protected area.

* * * * *